(12) United States Patent
Wangler

(10) Patent No.: US 6,243,206 B1
(45) Date of Patent: Jun. 5, 2001

(54) ILLUMINATING SYSTEM FOR VACUUM ULTRAVIOLET MICROLITHOGRAPHY

(75) Inventor: Johannes Wangler, Königsbronn (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 0 days.

(21) Appl. No.: 09/449,415

(22) Filed: Nov. 29, 1999

(30) Foreign Application Priority Data

Nov. 30, 1998 (DE) .............................................. 198 55 106

(51) Int. Cl.[7] .................................................. G02B 27/10
(52) U.S. Cl. .................... 359/621; 359/623; 359/710; 355/53; 355/67; 362/268
(58) Field of Search .................... 359/618, 619, 359/621, 623, 624, 710; 355/53, 67; 362/268

(56) References Cited

U.S. PATENT DOCUMENTS

| | | | |
|---|---|---|---|
| 5,798,866 | * 8/1998 | De Vaan | 359/621 |
| 5,844,727 | * 12/1998 | Partlo | 359/710 |
| 5,959,779 | * 9/1999 | Yamazaki et al. | 359/624 |
| 6,061,179 | * 5/2000 | Inoguchi et al. | 359/621 |
| 6,100,961 | * 8/2000 | Shiraishi et al. | 355/67 |

OTHER PUBLICATIONS

"Cylindrical lens arrays homogenize excimer beam" by Y. A. Carts, Laser Focus World, Nov. 1991.

\* cited by examiner

*Primary Examiner*—Loha Ben
(74) *Attorney, Agent, or Firm*—Walter Ottesen

(57) ABSTRACT

An illuminating system for the vacuum ultraviolet (VUV) microlithography (at 157 nm) is disclosed and has a VUV light source (1), refractive optical elements of fluoride, at least one microlens array (3, 5) functioning as an element for increasing the light conductance value, and at least one honeycomb condenser (7a, 7b). The honeycomb condenser is preferably configured of crossed cylinder lens arrays.

18 Claims, 1 Drawing Sheet

ILLUMINATING SYSTEM FOR VACUUM ULTRAVIOLET MICROLITHOGRAPHY

BACKGROUND OF THE INVENTION

The 157 nm technology on the basis of the $F_2$ excimer laser proceeds from the development of the microlithographic projection illumination apparatus for using ever lower light wavelengths. This 157 nm technology has been under development for some time.

In the deep ultraviolet range, experience with suitable illuminating systems is already present with different components and functions which are also necessary for the 157 nm technology in order to illuminate a sufficiently large field homogeneously, telecentrically and with a selectable degree of coherence σ.

A problem associated therewith is that the availability of transmitting materials is greatly limited. Only $CaF_2$ is already established as an optical material and is adequately permeable. Other fluorides are also known as being useable. However, attention has to be paid to minimalization of glass paths because the absorption is significantly higher compared to known deep ultraviolet systems and the resistance to radiation is reduced.

SUMMARY OF THE INVENTION

In view of the above, it is an object of the invention to provide an illuminating system which satisfies these various requirements in the vacuum ultraviolet range.

The illuminating system for vacuum ultraviolet microlithography of the invention includes: a vacuum ultraviolet light source; at least one refractive optical element of a fluoride; at least one microlens array defining a light-conductance value increasing unit; and, at least one honeycomb condenser.

German patent publication 195 20 563 A1 corresponds to United States patent application Ser. No. 08/658,605, filed on Jun. 5, 1996, and abandoned in favor of continuation application Ser. No. 09/315,267, filed May 20, 1999, and discloses an illuminating arrangement for a projection microlithographic apparatus in the deep ultraviolet range and is incorporated herein by reference. The present invention builds upon the teaching in this application but departs therefrom for the light mixing element because the glass rod is long and therefore has high absorption. Instead of the glass rod preferred in the above application, the invention utilizes the honeycomb condenser known in other conventional illuminating systems.

BRIEF DESCRIPTION OF THE DRAWING

The invention will now be described with reference to the single figure (FIG. 1) of the drawing which shows a schematic of an embodiment of the illuminating system according to the invention.

DESCRIPTION OF THE PREFERRED EMBODIMENTS OF THE INVENTION

Figure 1:
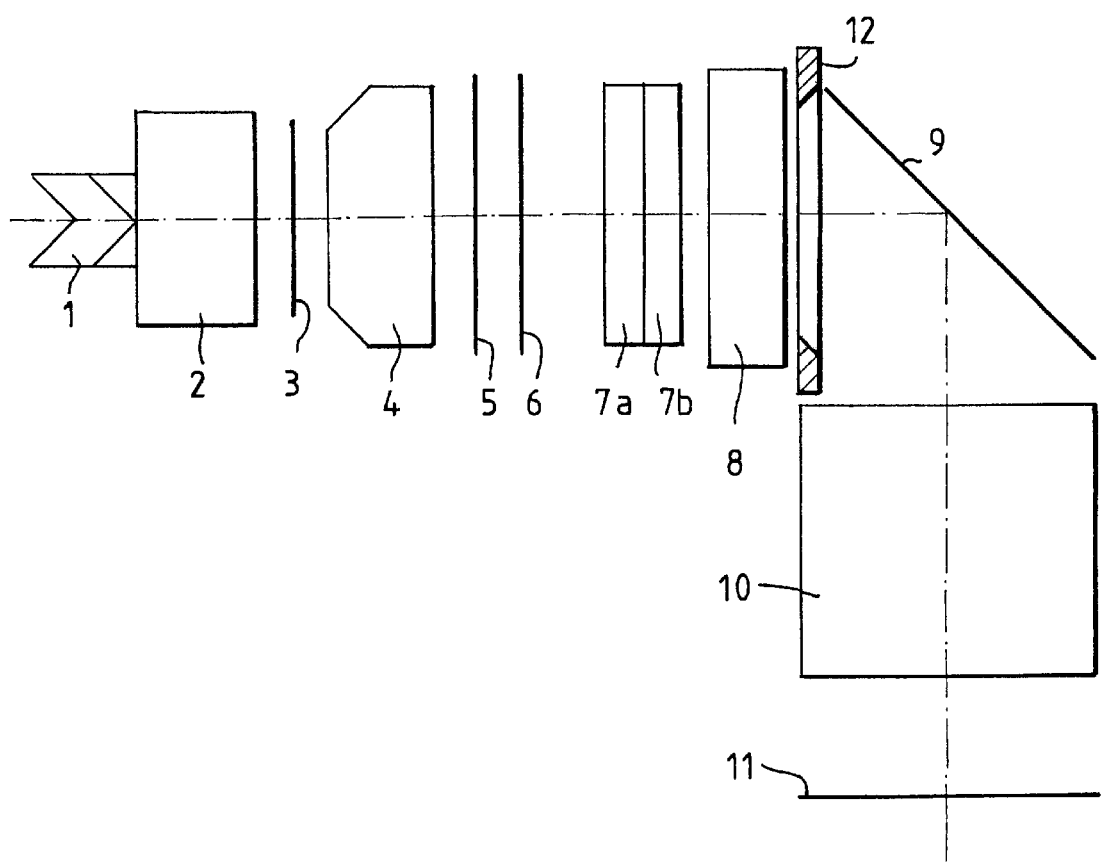

In FIG. 1, reference numeral 1 identifies a vacuum ultraviolet (VUV) excimer laser, that is, especially an $F_2$ laser having a 157 nm wavelength. The beam transmission and expansion system 2 supplies light to the projection illuminating apparatus and adapts the beam cross section to the requirement. The light conducting value (also Etendu-invariant or Lagrange-invariant) is, however, minimal because of the low divergence of the laser 1 (approximately 1 mrad) and is far from adequate for filling (illuminating) the required aperture of a projection objective with a suitable illuminating field.

Two microlens arrays 3 and 5 are preferably of $CaF_2$ and introduce an increased light conducting value. An intermediately mounted zoom objective 4 makes possible the adaptation of the degree of coherence σ (or the pupil fill). In a manner known per se, an adjustable axicon can be integrated into the zoom objective 4, which, inter alia, makes possible a variable annular aperture illumination.

The second microlens array 5 preferably has individual elements all having the same shape and having a similar aspect ratio as the reticle mask and as the object field and image field of the projection objective which is provided. The individual elements have especially a rectangular form.

Element 6 is a diffusing screen provided as an option and has a diffuse scattering. The element 6 can, for example, be an etched $CaF_2$ disc for improving the light conducting value and homogeneity.

Elements 7a anc 7b are the two lens rasters of a honeycomb condenser. The elements 7a and 7b can, for example, be configured as a microlens array as sold, for example, by Teledyne Brown Engineering, of Huntsville, Alabama. Or, the elements 7a and 7b can comprise a pair of crossed cylinder stacks as described, for example, in the article of Y. A. Carts entitled "Cylindrical Lens Arrays homogenize Excimer Beams" in the journal "Laser Focus World", Nov. 1991, page 39. The number of the raster elements is, however, increased by one or more orders of magnitude. For example, a cross section of 4×4 $cm^2$ is provided having rod lenses of 1 mm thickness, that is, in the order of magnitude of $10^2$ to $10^3$ and more rod lenses, that is, array elements of one more order of magnitude. The two lens rasters (7a, 7b) are arranged in the mutually opposite focal planes in a honeycomb condenser and this is different from that described in the article above by Y. A. Carts. $CaF_2$ or another fluoride is provided as a material. The diameter of the honeycomb condenser extends up to approximately 100 mm.

Relay optics 8, a planar deflecting mirror 9 and field lens optics 10 are mounted downstream of the two lens rasters (7a, 7b) as shown. Preferably, aspheric lenses are provided therein in order to hold the number of lenses low and the total glass thickness low. Preferably, a reticle masking system 12 is integrated, that is, a field diaphragm which is imaged exactly onto the reticle 11 (mask). The beam cross section of the reticle mask system 12 is adjustable (for example, by movable aperture blades) to make possible a precise adaptation to the object field of the mask.

The large number of elements of the honeycomb condenser (7a, 7b), that is, the fine rastering, ensures a uniform function over the entire field in each direction when the pupil is varied. Compared to known arrays with approximately 10 elements, uniformity and stability is increased by far.

The technology of the diffractive optic (DOE), the binary optic and the zone plates (Fresnel lenses) are very well suited to configure the light-conductance value increasing elements (3, 5) as well as the lens arrays of the honeycomb condensers (7a, 7b).

This system has united all the required functional elements for an illuminating system for microlithography in a way which ensures an adequate transmission even in the VUV range, for example, at 157 nm. Especially zoom objective 4 including the axicon, relay 8 and field lens 10 can contain mirrors, preferably as catadioptric systems. In addition to $CaF_2$, another material such as a fluoride (for example, $BaF_2$, $SrF_2$, NaF, LiF) can be used for the transmitting optical elements.

It is understood that the foregoing description is that of the preferred embodiments of the invention and that various changes and modifications may be made thereto without departing from the spirit and scope of the invention as defined in the appended claims.

What is claimed is:

1. An illuminating system for vacuum ultraviolet microlithography comprising along an optical axis of the system:
   a vacuum ultraviolet light source;
   at least one refractive optical element of a fluoride;
   at least one microlens array defining a light-conductance value increasing unit; and,
   at least one honeycomb condenser.

2. The illuminating system of claim 1, wherein said refractive optical elements are of calcium fluoride.

3. The illuminating system of claim 1, said honeycomb condenser comprising crossed cylinder arrays.

4. The illuminating system of claim 3, wherein said crossed arrays are configured from rod lenses.

5. The illuminating system of claim 1, wherein said illuminating system further comprises at least one of the following: a mirror or one or more refractive optical elements made of a second material different from said fluoride.

6. The illuminating system of claim 1, wherein said one microlens array is a first microlens array; and, wherein said illuminating system further comprises a second microlens array arranged downstream of said first microlens array; and, an objective interposed between said first and second microlens arrays.

7. The illuminating system of claim 6, wherein said objective is a zoom objective configured to adjust the degree of coherence.

8. The illuminating system of claim 6, wherein said illuminating system is configured to illuminate a field; and, said second microlens array including a plurality of raster elements approximately geometrically similar to the illuminated field.

9. The illuminating system of claim 1, further comprising a relay optic and a field lens arranged on said optical axis downstream of said honeycomb condenser.

10. The illuminating system of claim 1, consisting only of refractive elements, optical aperture plates and optical plane mirrors.

11. The illuminating system of claim 1, wherein said honeycomb condenser comprises: two plates and each of said plates including two arrays of crossed cylinder lenses made of calcium fluoride and each of said arrays having a number of cylinder lenses in the order of magnitude of 100 to 10,000.

12. The illuminating system of claim 11, wherein said two arrays are configured of stacked rods.

13. The illuminating system of claim 11, wherein said two arrays are configured of microstructured plates.

14. The illuminating system of claim 1, further comprising an adjustable reticle masking system arranged downstream of said honeycomb condenser.

15. The illuminating system of claim 1, wherein at least one of said one microlens array and said honeycomb condenser includes one of the following: diffractive elements, binary optical elements and zone plate elements.

16. A honeycomb condenser comprising two plates and each of said plates including two arrays of crossed cylinder lenses made of calcium fluoride and each of said arrays having a number of cylinder lenses in the order of magnitude of 100 to 10,000.

17. The honeycomb condenser of claim 16, wherein said two arrays are configured of stacked rods.

18. The honeycomb condenser of claim 16, wherein said two arrays are configured of microstructured plates.

* * * * *